United States Patent
Peng et al.

(10) Patent No.: US 12,557,640 B2
(45) Date of Patent: Feb. 17, 2026

(54) THREE DIMENSIONAL (3D) MEMORY DEVICE AND FABRICATION METHOD USING SELF-ALIGNED MULTIPLE PATTERNING AND AIRGAPS

(71) Applicant: Yangtze Memory Technologies Co., Ltd., Wuhan (CN)

(72) Inventors: Jin Peng, Wuhan (CN); Zuhui Zheng, Wuhan (CN); Zheng Xiang, Wuhan (CN); Yanwei Shi, Wuhan (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 522 days.

(21) Appl. No.: 17/644,307

(22) Filed: Dec. 14, 2021

(65) Prior Publication Data

US 2023/0133691 A1    May 4, 2023

Related U.S. Application Data

(63) Continuation of application No. PCT/CN2021/128557, filed on Nov. 4, 2021.

(51) Int. Cl.
*H01L 21/768* (2006.01)
*H01L 21/033* (2006.01)
(Continued)

(52) U.S. Cl.
CPC ...... *H01L 21/7682* (2013.01); *H01L 21/0337* (2013.01); *H01L 21/76838* (2013.01);
(Continued)

(58) Field of Classification Search
CPC ............ H01L 21/0338; H01L 21/0335; H01L 21/0337; H01L 2221/1042;
(Continued)

(56) References Cited

U.S. PATENT DOCUMENTS 6,211,057 B1 * 4/2001 Lin .................. H01L 21/76801
                                                    438/634
6,251,799 B1 * 6/2001 Lai ..................... H01L 21/7682
                                                    438/760
(Continued)

FOREIGN PATENT DOCUMENTS

CN    107464812 A    12/2017
CN    107895711 A  *  4/2018    .......... H01L 23/528
(Continued)

OTHER PUBLICATIONS

The World Intellectual Property Organization (WIPO) International Search Report for PCT/CN2021/128557 Apr. 8, 2022 5 pages.
(Continued)

*Primary Examiner* — Ratisha Mehta
*Assistant Examiner* — Brad A Knudson
(74) *Attorney, Agent, or Firm* — Conley Rose, P.C.

(57) ABSTRACT

Three-dimensional (3D) NAND memory devices and methods are provided. In one aspect, a fabrication method includes forming a conductor/insulator stack over a substrate, configuring memory cells through the conductor/insulator stack, forming a conductive layer, removing a portion of the conductive layer to form an opening in the conductive layer, depositing a dielectric material in a space of the opening, and forming an airgap in the space.

20 Claims, 13 Drawing Sheets

(51) Int. Cl.
*H01L 23/00* (2006.01)
*H01L 25/00* (2006.01)
*H01L 25/18* (2023.01)
*H10B 41/27* (2023.01)
*H10B 41/50* (2023.01)
*H10B 43/27* (2023.01)
*H10B 43/50* (2023.01)
*H10B 80/00* (2023.01)

(52) U.S. Cl.
CPC .............. *H01L 24/03* (2013.01); *H01L 24/80* (2013.01); *H01L 25/18* (2013.01); *H01L 25/50* (2013.01); *H10B 41/27* (2023.02); *H10B 41/50* (2023.02); *H10B 43/27* (2023.02); *H10B 43/50* (2023.02); *H10B 80/00* (2023.02); *H01L 21/0338* (2013.01); *H01L 2221/1042* (2013.01); *H01L 2221/1047* (2013.01); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC ........ H01L 2221/1047; H01L 21/7682; H10B 41/27; H10B 43/27
See application file for complete search history.

(56) References Cited

U.S. PATENT DOCUMENTS

| | | |
|---|---|---|
| 9,679,913 B1 | 6/2017 | Hu et al. |
| 10,490,447 B1 | 11/2019 | Cheng et al. |
| 2014/0083972 A1 | 3/2014 | Oyama et al. |
| 2014/0131883 A1 | 5/2014 | Huang et al. |
| 2021/0408028 A1* | 12/2021 | Kim ...................... H10B 41/27 |
| 2022/0051930 A1* | 2/2022 | Gupta ............... H01L 21/76816 |

FOREIGN PATENT DOCUMENTS

| | | | |
|---|---|---|---|
| CN | 108550564 A | 9/2018 | |
| CN | 111180461 A | 5/2020 | |
| CN | 111971795 A | 11/2020 | |
| CN | 113169117 A | 7/2021 | |
| WO | WO-2020112388 A1 * | 6/2020 | ......... H01L 21/7682 |

OTHER PUBLICATIONS

Yangtze Memory Technologies Co., Ltd., "First Examination Opinion Notice," mailed May 19, 2025, CN App. No. 20218000446.7, 8 p. (translation also 8 p.).

* cited by examiner

THREE DIMENSIONAL (3D) MEMORY DEVICE AND FABRICATION METHOD USING SELF-ALIGNED MULTIPLE PATTERNING AND AIRGAPS

CROSS-REFERENCE TO RELATED APPLICATION

This application claims the priority to PCT Patent Application No. PCT/CN2021/128557 filed on Nov. 4, 2021, the entire content of which is incorporated herein by reference.

FIELD OF THE TECHNOLOGY

This application relates generally to the field of semiconductor technology and, specifically, to a three-dimensional (3D) memory device and fabrication method using self-aligned multiple patterning (SAMP) and airgaps.

BACKGROUND OF THE DISCLOSURE

Not-AND (NAND) memory is a non-volatile type of memory that does not require power to retain stored data. The growing demands of consumer electronics, cloud computing, and big data bring about a constant need of NAND memories of larger capacity and better performance. As conventional two-dimensional (2D) NAND memory approaches its physical limits, three-dimensional (3D) NAND memory is now playing an important role. 3D NAND memory uses multiple stack layers on a single die to achieve higher density, higher capacity, faster performance, lower power consumption, and better cost efficiency.

Self-aligned multiple patterning (SAMP) is a method that uses sidewall spacers to reduce the pitch of a mandrel pattern and break the lithography limit. Narrower metal lines with smaller spacing are made by SAMP. These metal lines, however, suffer from increased resistance and capacitance, affecting the program speed of a 3D NAND device.

SUMMARY

In one aspect of the present disclosure, a method for fabricating a 3D memory device includes providing a substrate for the 3D memory device, forming a conductor/insulator stack over a top surface of the substrate, configuring memory cells through the conductor/insulator stack, forming a conductive layer including a conductive material over a part of the conductor/insulator stack, removing a portion of the conductive layer to form an opening in the conductive layer and a sidewall in the opening, depositing a dielectric material in a space of the opening, and forming an airgap in the space. A functional layer extends through the conductor/insulator stack and is formed between a semiconductor channel and the conductor/insulator stack. Each memory cell includes a portion of the functional layer and the semiconductor channel. A surface of the sidewall includes the conductive material. The dielectric material surrounds the airgap.

In another aspect of the present disclosure, a 3D memory device includes a substrate, a conductor/insulator stack formed over the substrate, a functional layer and a semiconductor channel extending through the conductor/insulator stack, memory cells formed through the conductor/insulator stack, and conductive blocks formed of a conductive material, with sidewalls formed of the conductive material, and formed over a part of the conductor/insulator stack. The functional layer is formed between the semiconductor channel and the conductor/insulator stack. Each memory cell includes a portion of the functional layer and a portion of the semiconductor channel. The sidewalls are separated by a space having a dielectric material and an airgap. The airgap is surrounded by the dielectric material.

In another aspect of the present disclosure, a method for forming metal blocks with a pattern includes providing a substrate, forming a metal layer over the substrate, forming a mask layer over the metal layer, forming the pattern over the mask layer, forming a patterned mask layer according to the pattern, removing a portion of the metal layer to form an opening in the metal layer and two opposite sidewalls in the opening based on the patterned mask layer, depositing a dielectric material in a space of the opening, and forming an airgap in the space. The dielectric material surrounds the airgap. A distance between the two opposite sidewalls is 50 nanometers or less.

In another aspect of the present disclosure, a memory apparatus includes an input/output (I/O) component for receiving an input, a buffer for buffering a signal, a controller for implementing an operation, and a 3D memory device. The 3D memory device includes a substrate and conductive block. The conductive blocks are formed of a conductive material, have sidewalls formed of the conductive material, and are formed over a part of the substrate. The sidewalls are separated by a space having a dielectric material and an airgap. The airgap is surrounded by the dielectric material.

Other aspects of the present disclosure can be understood by those skilled in the art in light of the description, the claims, and the drawings of the present disclosure.

DETAILED DESCRIPTION

The following describes the technical solutions according to various aspects of the present disclosure with reference to the accompanying drawings. Wherever possible, the same reference numbers will be used throughout the drawings to refer to the same or like parts. Apparently, the described aspects are merely some but not all of the aspects of the present disclosure. Features in various aspects may be exchanged and/or combined.

FIGS. 1-11 schematically show a fabrication process of an exemplary 3D array device 100 according to aspects of the present disclosure. The 3D array device 100 is a part of a memory device and may also be referred to as a 3D memory structure. Among the figures, top views are in an X-Y plane and cross-sectional views are in a Y-Z plane or along a line in the X-Y plane.

Figure 1:
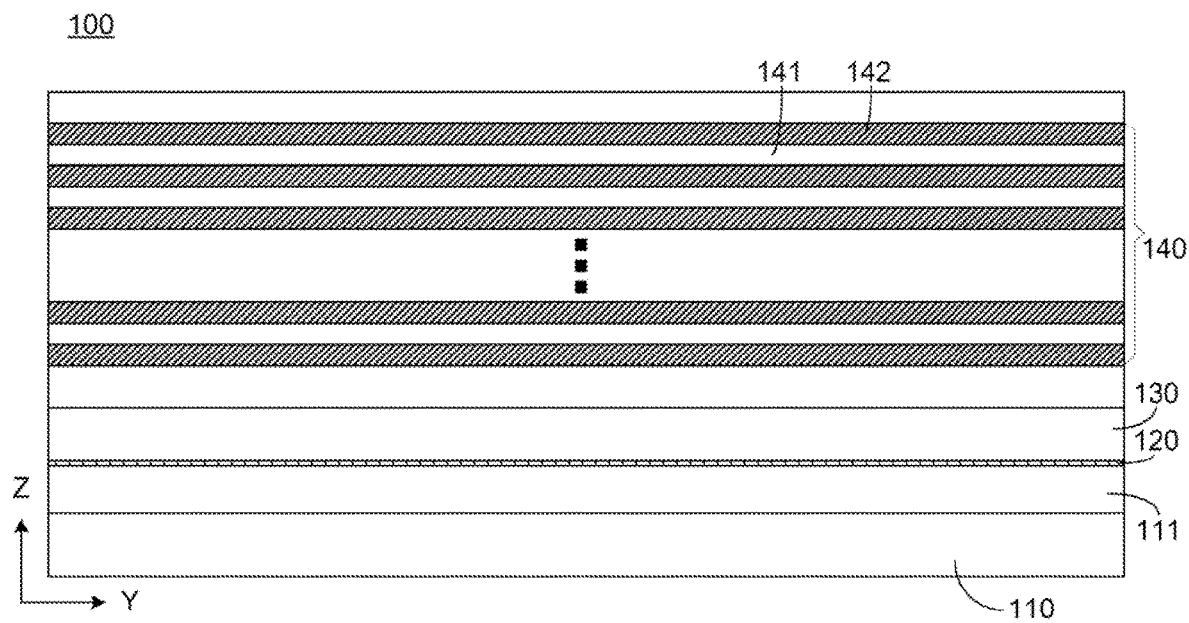
FIGS. 1 and 2 illustrate cross-sectional views of an exemplary three-dimensional (3D) array device at certain stages during a fabrication process according to various aspects of the present disclosure.

As shown in a cross-sectional view in FIG. 1, the 3D array device 100 includes a substrate 110. In some aspects, the substrate 110 may include a single crystalline silicon layer. The substrate 110 may also include a semiconductor material, such as germanium (Ge), silicon-germanium (SiGe), silicon carbide (SiC), silicon-on-insulator (SOI), germanium-on-insulator (GOI), polysilicon, or a Group III-V compound such as gallium arsenide (GaAs) or indium phosphide (InP). Optionally, the substrate 110 may also include an electrically non-conductive material such as glass, a plastic material, or a ceramic material. When the substrate 110 includes glass, plastic, or ceramic material, the substrate 110 may further include a thin layer of polysilicon deposited on the glass, plastic, or ceramic material. In this case, the substrate 110 may be processed like a polysilicon substrate. As an example, the substrate 110 includes an undoped or lightly doped single crystalline silicon layer in descriptions below.

In some aspects, a top portion of the substrate 110 is doped by n-type dopants via ion implantation and/or diffusion to form a doped region 111. The dopants of the doped region 111 may include, for example, phosphorus (P), arsenic (As), and/or antimony (Sb). As shown in FIG. 1, a cover layer 120 is deposited over the doped region 111. The cover layer 120 is a sacrificial layer and may include a single layer or a multilayer. For example, the cover layer 120 may include one or more of silicon oxide layer and silicon nitride layer. The cover layer 120 may be deposited by chemical vapor deposition (CVD), physical vapor deposition (PVD), atomic layer deposition (ALD), or a combination thereof. Further, the PVD may include the evaporation method and sputtering method. In some other aspects, the cover layer 120 may include another material such as aluminum oxide.

Further, over the cover layer 120, a sacrificial layer 130 is deposited. The sacrificial layer 130 may include a dielectric material, a semiconductor material, or a conductive material. The word "conductive", as used herein, indicates electrically conductive. An exemplary material for the sacrificial layer 130 is polysilicon.

After the polysilicon sacrificial layer 130 is formed, a dielectric stack 140 is formed. The dielectric stack 140 includes multiple pairs of stack layers, for example, including first dielectric layers 141 and second dielectric layers 142, stacked alternately over each other. The dielectric stack may include 64 pairs, 128 pairs, or more than 128 pairs of the first and second dielectric layers 141 and 142.

In some aspects, the first dielectric layers 141 and second dielectric layers 142 are made of different materials. In descriptions below, the first dielectric layer 141 includes a silicon oxide layer exemplarily, which may be used as an isolation stack layer, while the second dielectric layer 142 includes a silicon nitride layer exemplarily, which may be used as a sacrificial stack layer. The sacrificial stack layer will be subsequently etched out and replaced by a conductive stack layer. The first dielectric layers 141 and the second dielectric layers 142 may be deposited via CVD, PVD, ALD, or a combination thereof.

Figure 2:
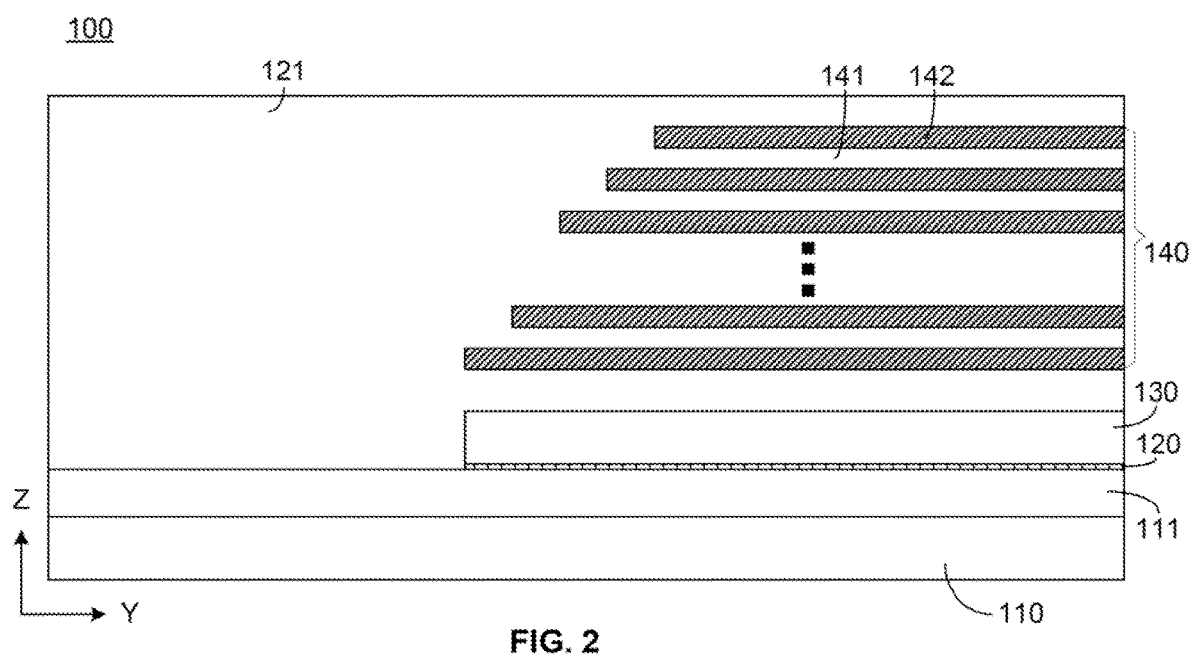

FIG. 2 shows a schematic cross-sectional view of the 3D array device 100 according to aspects of the present disclosure. As shown in FIG. 2, after the dielectric stack 140 is formed, a staircase formation process is performed to trim a part of the dielectric stack 140 into a staircase structure. Any suitable etching processes, including dry etch and/or wet etch process, may be used in the staircase formation process. For example, the height of the staircase structure may increase in a stepwise manner along the Y direction. A dielectric layer 121 is deposited to cover the staircase structure, the doped region 111, and the substrate 110. As shown in FIG. 2, the dielectric stack 140, the sacrificial layer 130, and the cover layer 120 are removed in a region on a side of the staircase structure, e.g., on the left side of the staircase structure. The region may be viewed as a contact region where through silicon contacts connected to contact pads may be configured or an opening for contact pads may be arranged. The word "connected" as used herein, indicates electrically connected. The contact region contains a portion of the dielectric layer 121 and thus is a dielectric region. In some aspects, the cover layer 120 is not etched away in the staircase formation process and a portion of the cover layer 120 may be buried under the dielectric layer 121 in the contact region.

Figure 3:
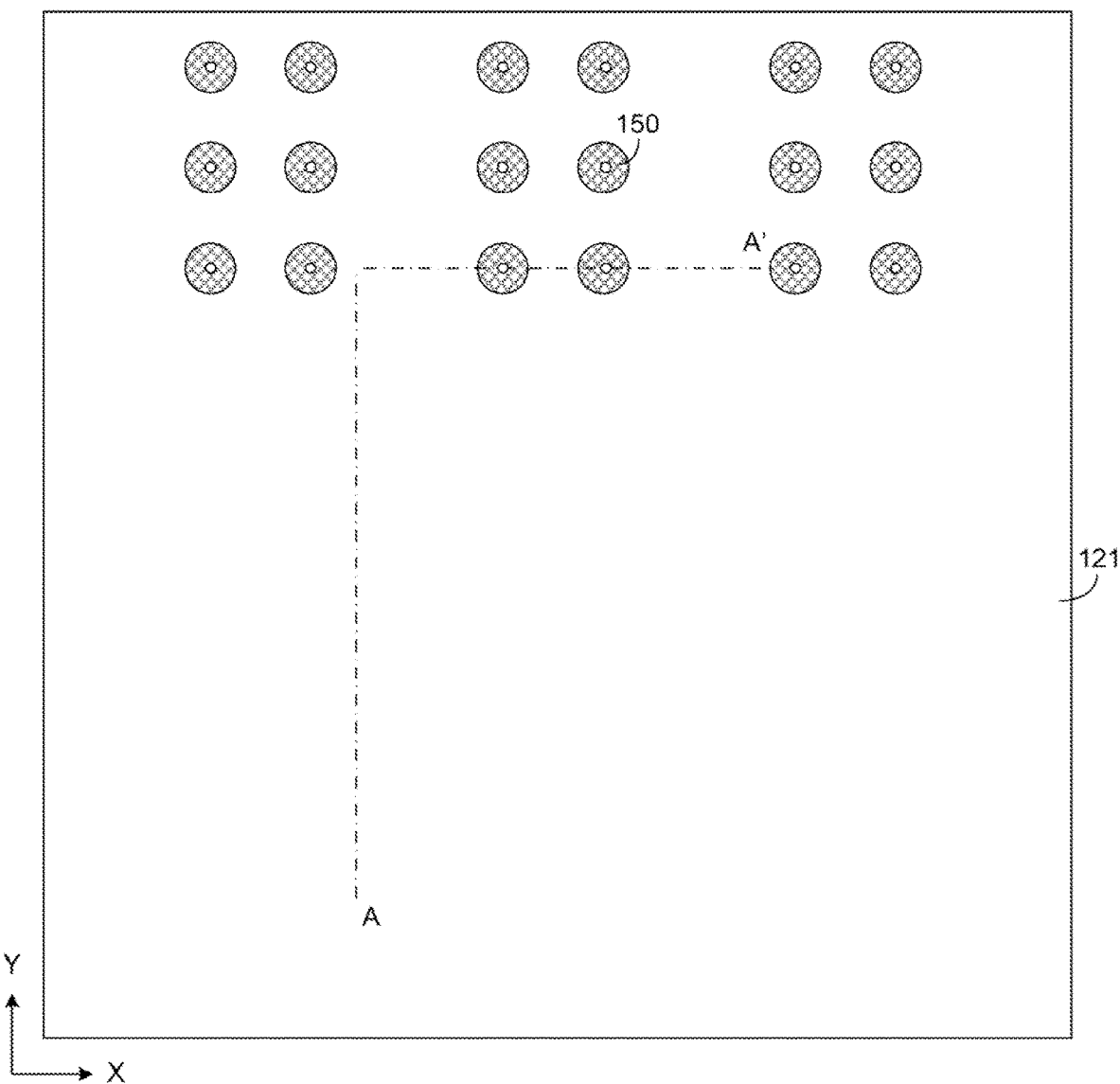
FIGS. 3 and 4 illustrate a top view and a cross-sectional view of the 3D array device shown in FIG. 2 after channel holes and functional layers are formed according to various aspects of the present disclosure.
Figure 4:
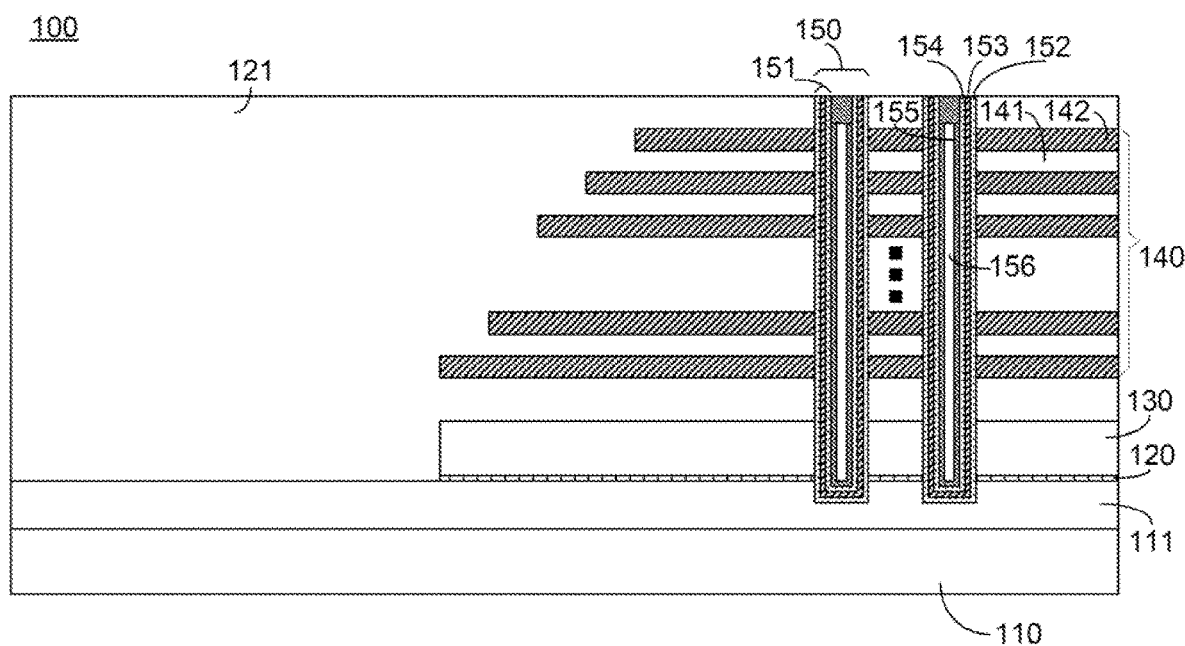

FIGS. 3 and 4 show a schematic top view and a schematic cross-sectional view of the 3D array device 100 after channel holes 150 are formed according to aspects of the present disclosure. The cross-sectional view shown in FIG. 4 is taken along a line AA' of FIG. 3. The quantity, dimension, and arrangement of the channel holes 150 shown in FIGS. 3 and 4 and in other figures in the present disclosure are exemplary and for description purposes, although any suitable quantity, dimension, and arrangement may be used for the disclosed 3D array device 100 according to various aspects of the present disclosure.

As shown in FIGS. 3 and 4, the channel holes 150 are arranged to extend in the Z direction or in a direction approximately perpendicular to the substrate 110 and form an array of a predetermined pattern (not shown) in the X-Y plane. The channel holes 150 may be formed by, for example, a dry etch process or a combination of dry and wet etch processes. Other processes may also be performed, such as a patterning process involving lithography, cleaning, and/or chemical mechanical polishing (CMP). The channel holes 150 may have a cylinder shape or pillar shape that extends through the dielectric stack 140, the sacrificial layer 130, the cover layer 120, and partially penetrates the doped region 111. After the channel holes 150 are formed, a functional layer 151 is deposited on the sidewall and bottom of the channel hole. The functional layer 151 includes a blocking layer 152 on the sidewall and bottom of the channel hole to block an outflow of charges, a charge trap layer 153 on a surface of the blocking layer 152 to store charges during an operation of the 3D array device 100, and a tunneling layer 154 on a surface of the charge trap layer 153. The blocking layer 152 may include one or more layers that may include one or more materials. The material for the blocking layer 152 may include silicon oxide, silicon nitride, silicon oxynitride, a high-k dielectric material such as aluminum oxide or hafnium oxide, or another wide bandgap material. The charge trap layer 153 may include one or more layers that may include one or more materials. The materials for the charge trap layer 153 may include polysilicon, silicon nitride, silicon oxynitride, nanocrystalline silicon, a high-k dielectric material such as aluminum oxide or hafnium oxide, or another wide bandgap material. The tunneling layer 154 may include one or more layers that may include one or more materials. The material for the tunneling layer 154 may include silicon oxide, silicon nitride, silicon oxynitride, a high-k dielectric material such as aluminum oxide or hafnium oxide, or another wide bandgap material.

Further, a semiconductor channel 155 is deposited on a surface of the tunneling layer 154. The semiconductor channel 155 includes a polysilicon layer in some aspects. Optionally, the semiconductor channel 155 may include an amorphous silicon layer. Like the channel holes, the semiconductor channel 155 also extends through the dielectric stack 140 and into the doped region 111. The blocking layer 152, the charge trap layer 153, the tunneling layer 154, and the semiconductor channel 155 may be deposited by, e.g., CVD and/or ALD. The structure formed in a channel hole 150, including the functional layer 151 and semiconductor channel 155, may be considered as a channel structure.

After the semiconductor channel 155 is formed, the opening of the channel hole 150 is filled by an oxide material 156 and a conductive plug, as shown in FIG. 4. The conductive plug includes a conductive material such as doped polysilicon.

In some cases, the functional layer 151 includes an oxide-nitride-oxide (ONO) structure. That is, the blocking layer 152 is a silicon oxide layer, the charge trap layer 153 is a silicon nitride layer, and the tunneling layer 154 is another silicon oxide layer. Optionally, the functional layer 151 may have a structure different from the ONO configuration. In the following descriptions, the ONO structure is used exemplarily.

Referring to FIG. 4, the channel holes 150 are etched after the staircase structure is formed. Optionally, the channel holes 150 may also be formed before the staircase formation process. For example, after the dielectric stack 140 is fabricated as shown in FIG. 1, the channel holes 150 may be formed and then the functional layer 151 and semiconductor channel 155 may be deposited. After the channel holes 150 are filled with the oxide material 156, the staircase formation process may be performed to form the staircase structure.

Figure 5:
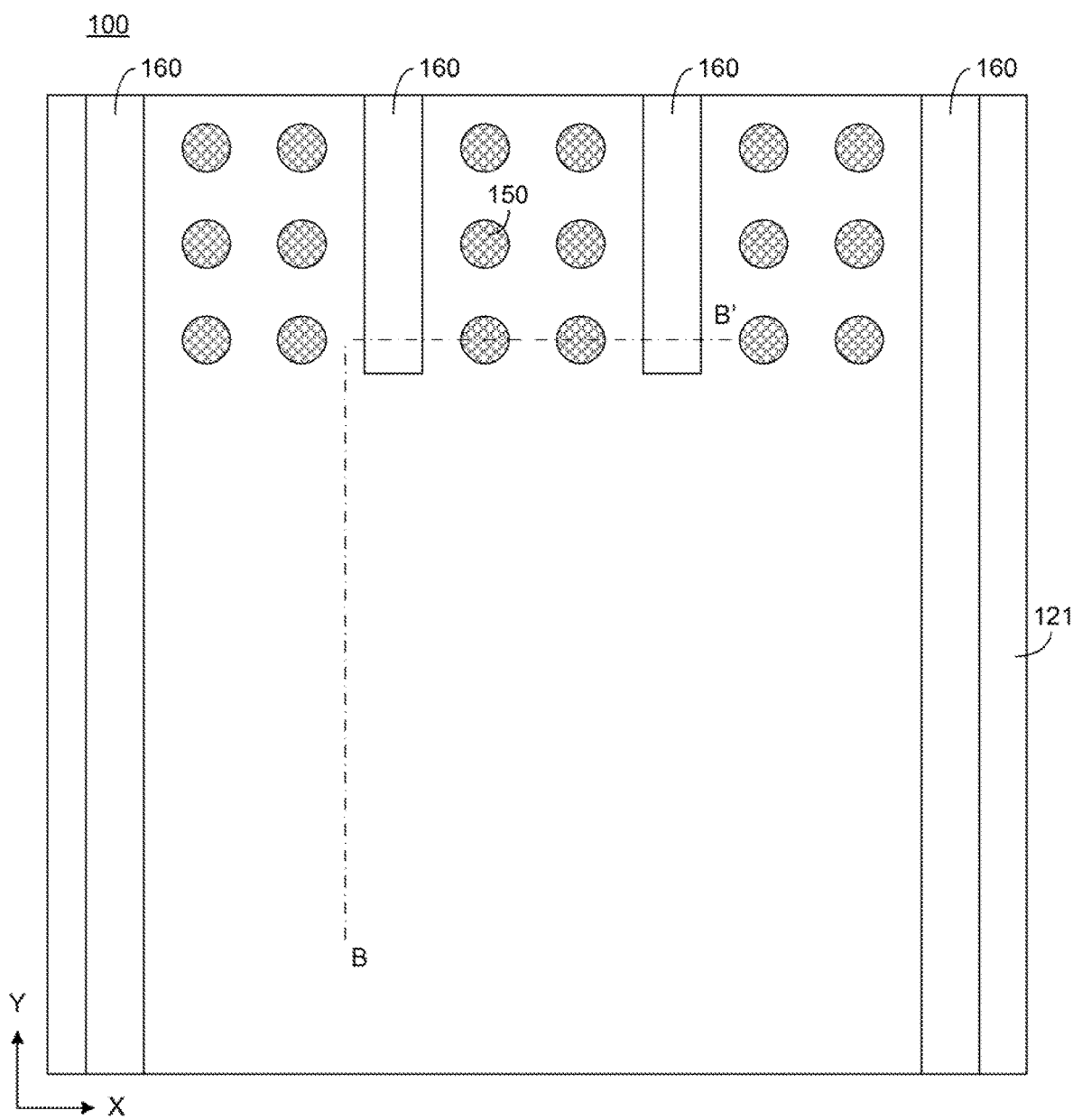
FIGS. 5 and 6 illustrate a top view and a cross-sectional view of the 3D array device shown in FIGS. 3 and 4 after gate line slits are formed according to various aspects of the present disclosure.
Figure 6:
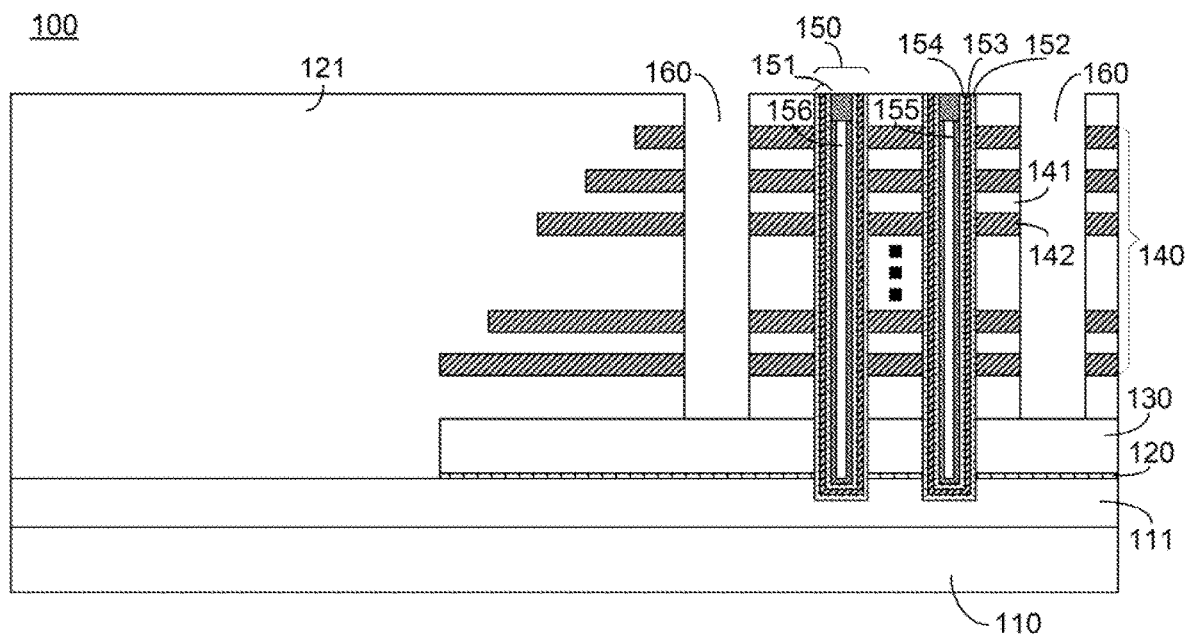

FIGS. 5 and 6 show a schematic top view and a schematic cross-sectional view of the 3D array device 100 after gate line slits 160 are formed according to aspects of the present disclosure. The cross-sectional view shown in FIG. 6 is taken along a line BB' of FIG. 5. A gate line slit may also be referred to as a gate line slit structure. The 3D array device 100 has a great number of channel holes 150 arranged in memory planes (not shown). Each memory plane is divided into memory blocks (not shown) and memory fingers by the gate line slits. For example, the configuration of the channel holes 150 as shown in FIG. 5 reflects memory fingers between the gate line slits 160.

The gate line slits 160 may be formed by, for example, a dry etch process or a combination of dry and wet etch processes. As shown in FIGS. 5 and 6, the gate line slits 160 extend, e.g., in the X and Y directions horizontally, and extend through the dielectric stack 140 and reach or partially penetrate the sacrificial layer 130 in the Z direction or in a direction approximately perpendicular to the substrate 110. As such, at the bottom of the gate line slit 160, the sacrificial layer 130 is exposed. Then, spacer layers (not shown) may be deposited on the sidewall and bottom of the gate line slit 160 by CVD and/or ALD. The spacer layers are configured to protect the first and second dielectric layers 141 and 142 and may include, for example, silicon oxide and silicon nitride.

After the spacer layers are deposited, selective etching is performed such that parts of the spacer layers at the bottom of the gate line slits 160 are removed by dry etch or a combination of dry etch and wet etch. The sacrificial layer 130 is exposed again. Subsequently, a selective etch process, e.g., a selective wet etch process, is performed to remove the sacrificial layer 130. Removal of the sacrificial layer 130 creates a cavity and exposes the cover layer 120 and bottom portions of the blocking layers 152 formed in the channel holes 150. Further, multiple selective etch processes, e.g., multiple selective wet etch processes, are performed to remove the exposed portions of the blocking layer 152, the charge trap layer 153, and the tunneling layer 154 consecutively, which exposes bottom side potions of the semiconductor channel 155.

When the cover layer 120 is silicon oxide and/or silicon nitride, the cover layer 120 may be removed when the bottom portions of the functional layers 151 are etched away. In certain aspects, the cover layer 120 includes a material other than silicon oxide or silicon nitride, and the cover layer 120 may be removed by one or more additional selective etch processes. Removal of the cover layer 120 exposes the top surface of the doped region 111.

After the etch processes, the doped region 111 and side portions of the semiconductor channel 155 close to the bottom of the channel hole 150 are exposed in the cavity left by etching away the sacrificial layer 130 and the cover layer 120. The cavity is filled by a semiconductor material, e.g., polysilicon, to form a semiconductor layer 131, e.g., by a CVD and/or ALD deposition process. The semiconductor layer 131 is n-doped, formed on the exposed surface of the doped region 111 and on sidewalls or side portions of the semiconductor channel 155, and connected to the doped region 111 and the semiconductor channel 155.

Optionally, a selective epitaxial growth is performed such that a layer of single crystalline silicon may be grown on the exposed surface of the doped region 111 and a polysilicon layer may be grown on the exposed surface of the semiconductor channel 155. Thus, the semiconductor layer 131 may include adjoined layers of single crystalline silicon and polysilicon.

Figure 7:
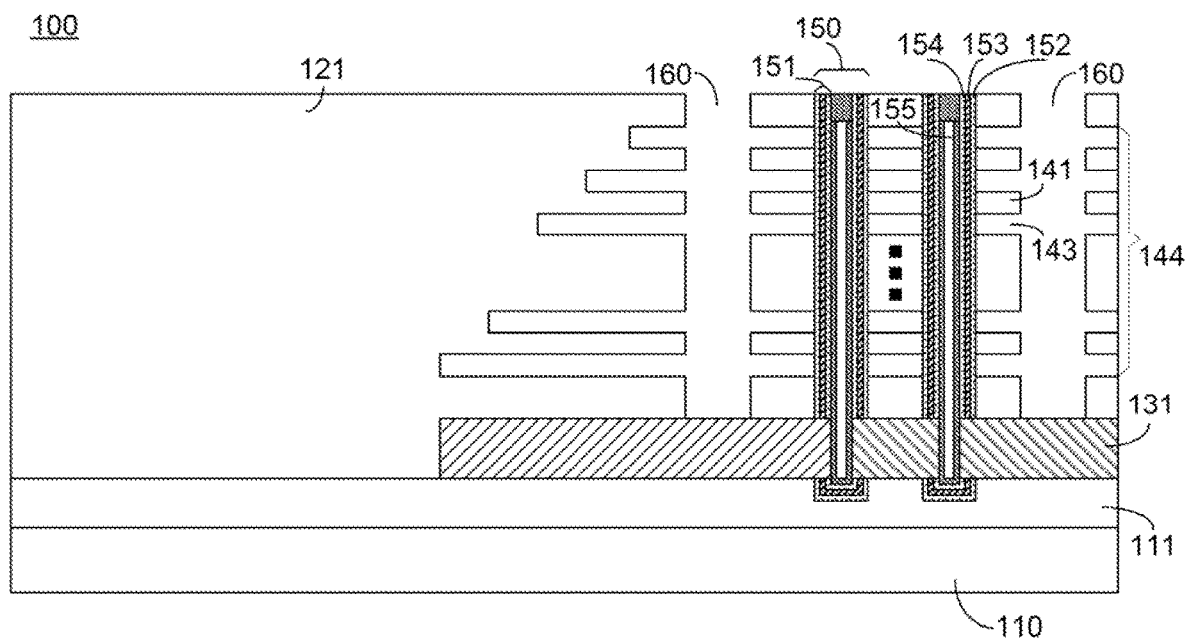
FIGS. 7, 8, and 9 illustrate cross-sectional views of the 3D array device shown in FIGS. 5 and 6 at certain stages in the fabrication process according to various aspects of the present disclosure.

When the bottom parts of the functional layer 151 and the cover layer 120 are etched, some spacer layers are etched away and the rest spacer layers remain on the sidewall of the gate line slits 160 to protect the first and second dielectric layers 141 and 142. After the semiconductor layer 131 is formed, the remaining spacer layers are removed in a selective etch process, e.g., a selective wet etch process, which exposes the sides of the second dielectric layer 142 around the gate line slits 160. In some aspects, the innermost spacer layer, which is in contact with the sidewall, is silicon nitride. Because the second dielectric layers 142 are also silicon nitride, the innermost spacer layer and the second dielectric layers 142 may be removed together during the etch process, leaving cavities 143 between the first dielectric layers 141, as shown in FIG. 7. As such, the dielectric stack 140 is changed into a dielectric stack 144.

Figure 8:
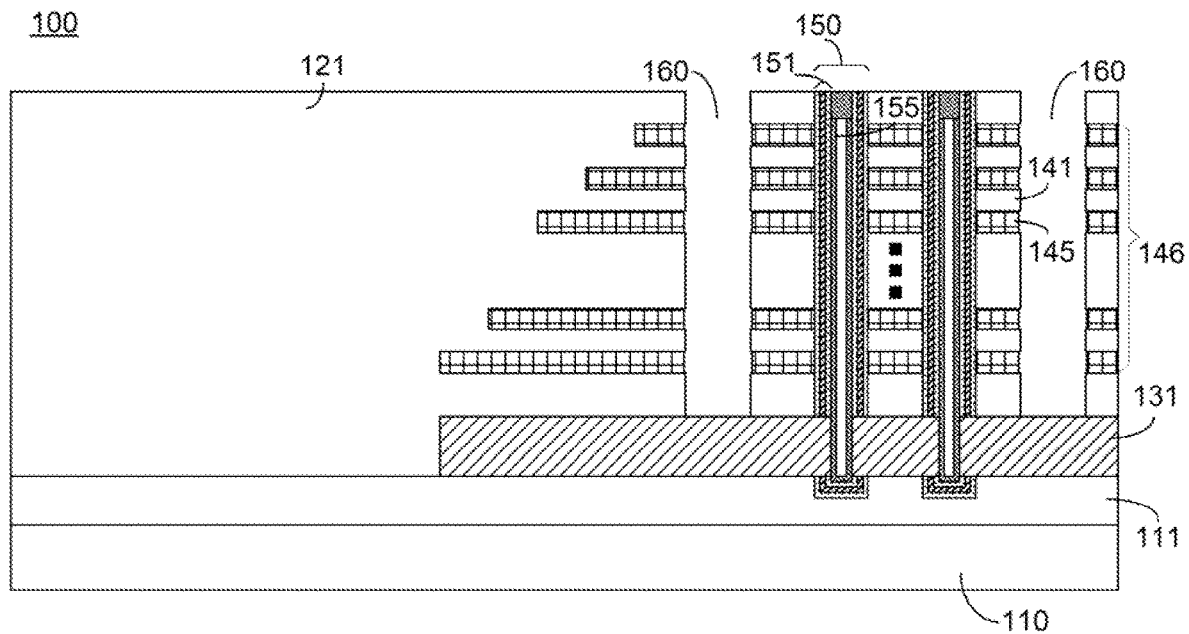

Referring to FIG. 7, the cavity 143 exposes certain portions of the blocking layer 152. Further, a conductive material such as tungsten (W) is grown to fill the cavities 143 left by the removal of the second dielectric layers 142, forming conductive layers 145 between the first dielectric layers 141. After the conductive layers 145 are fabricated, the dielectric stack 144 is converted into a conductor/insulator stack 146, as shown in FIG. 8. The conductor/insulator stack 146 includes the first dielectric layers 141 and the conductive layers 145 that are alternatingly stacked over each other.

In some aspects, before metal W is deposited in the cavities 143, a dielectric layer (not shown) of a high-k dielectric material such as aluminum oxide may be deposited. Further, a layer of a conductive material such as titanium nitride (TiN) (not shown) is deposited, and then metal W is deposited to form the conductive layers 145. CVD and/or ALD may be used in the deposition processes. Alternatively, another conductive material, such as cobalt (Co), copper (Cu), aluminum (Al), titanium (Ti), tantalum (Ta), tantalum nitride (TaN), doped silicon, or any combination thereof, may be used to form the conductive layers 145.

Referring to FIG. 8, a portion of each functional layer 151 in a channel hole 150 is between a portion of one of the conductive layers 145 and a portion of a semiconductor channel 155 in the channel hole 150. Each conductive layer 145 is configured to connect rows of NAND memory cells in an X-Y plane and is configured as a word line for the 3D array device 100. The semiconductor channel 155 formed in the channel hole 150 is configured to connect a column or a string of NAND memory cells along the Z direction and configured as a bit line for the 3D array device 100. As such, a portion of the functional layer 151 in the channel hole 150 in the X-Y plane, as a part of a NAND memory cell, is arranged between a conductive layer 145 and a semiconductor channel 155, i.e., between a word line and a bit line. The functional layer 151 may also be considered as disposed between the semiconductor channel 155 and the conductor/insulator stack 146. A portion of the conductive layer 145 that is around a portion of the channel hole 150 functions as a control gate or gate electrode for a NAND memory cell. The 3D array device 100 can be considered as including a 2D array of strings of NAND cells (such a string is also referred to as a "NAND string"). Each NAND string contains multiple NAND memory cells and extends vertically toward the substrate 110. The NAND strings form a 3D array of the NAND memory cells through the conductor/insulator stack 146 over the substrate 110.

Figure 9:
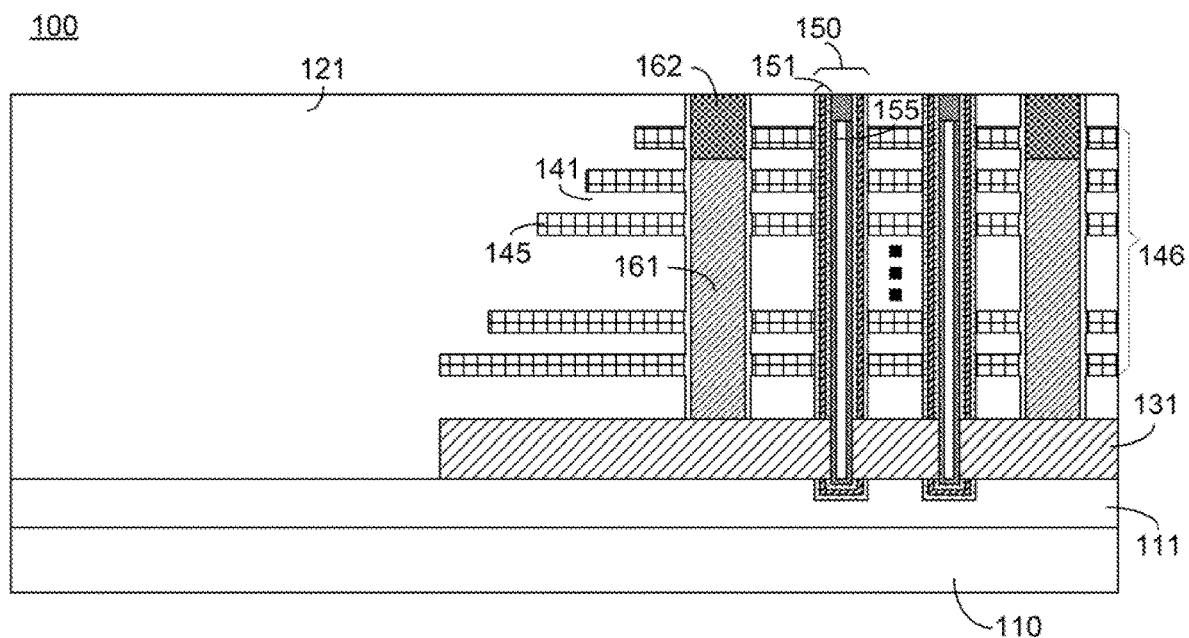

After the conductive layers 145 are grown in the cavities 143, a dielectric layer (e.g., a silicon oxide layer) may be deposited on the sidewalls and bottom surfaces of the gate line slits 160 by CVD and/or ALD. A dry etch process or a combination of dry etch and wet etch processes may be performed to remove the dielectric layer at the bottom of the gate line slits to expose parts of the semiconductor layer 131. The gate line slits are filled with a conductive material 161 (e.g., doped polysilicon) and a conductive plug 162 (e.g., metal W). The conductive material 161 in the gate line slit extends through the conductor/insulator stack 146 and contacts the semiconductor layer 131, as shown in FIG. 9. The word "contact" as a verb indicates electrically contacting an object as used herein. The filled gate line slits become an array common source for the 3D array device 100 in some aspects. Optionally, forming the array common source in the gate line slits includes depositing an insulation layer, a conductive layer (such as TiN, W, Co, Cu, or Al), and then a conductive material such as doped polysilicon.

Figure 10:
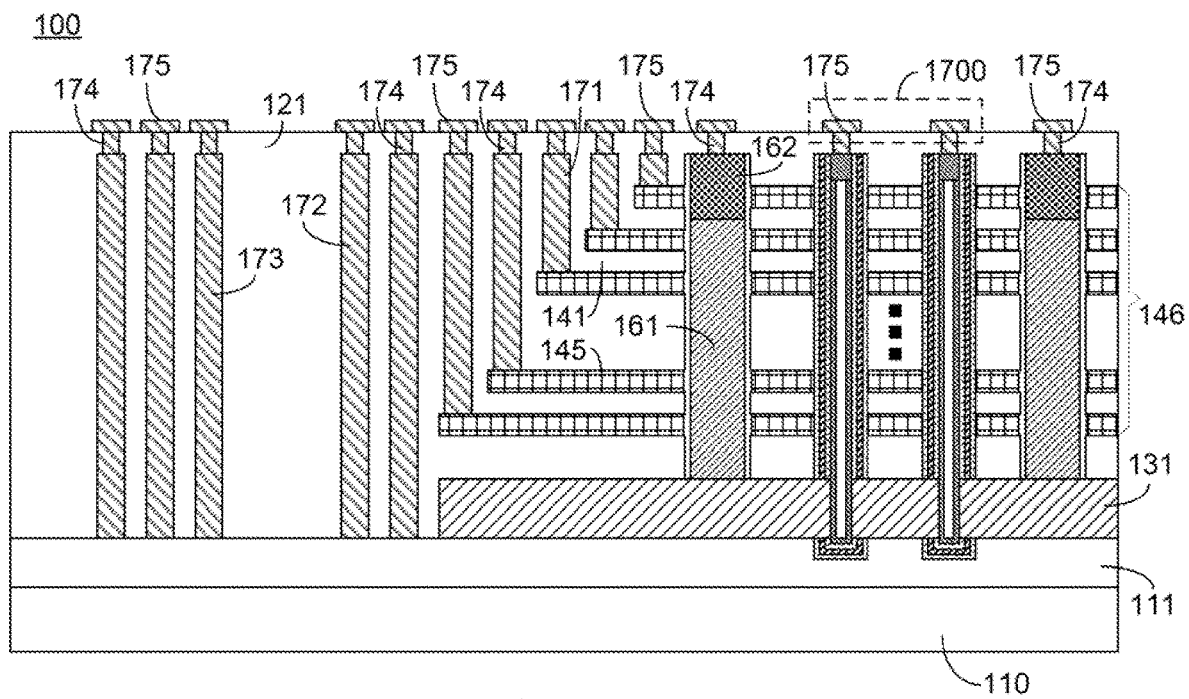
FIGS. 10 and 11 illustrate cross-sectional views of the 3D array device shown in FIG. 9 at certain stages in the fabrication process according to various aspects of the present disclosure.
Figure 11:
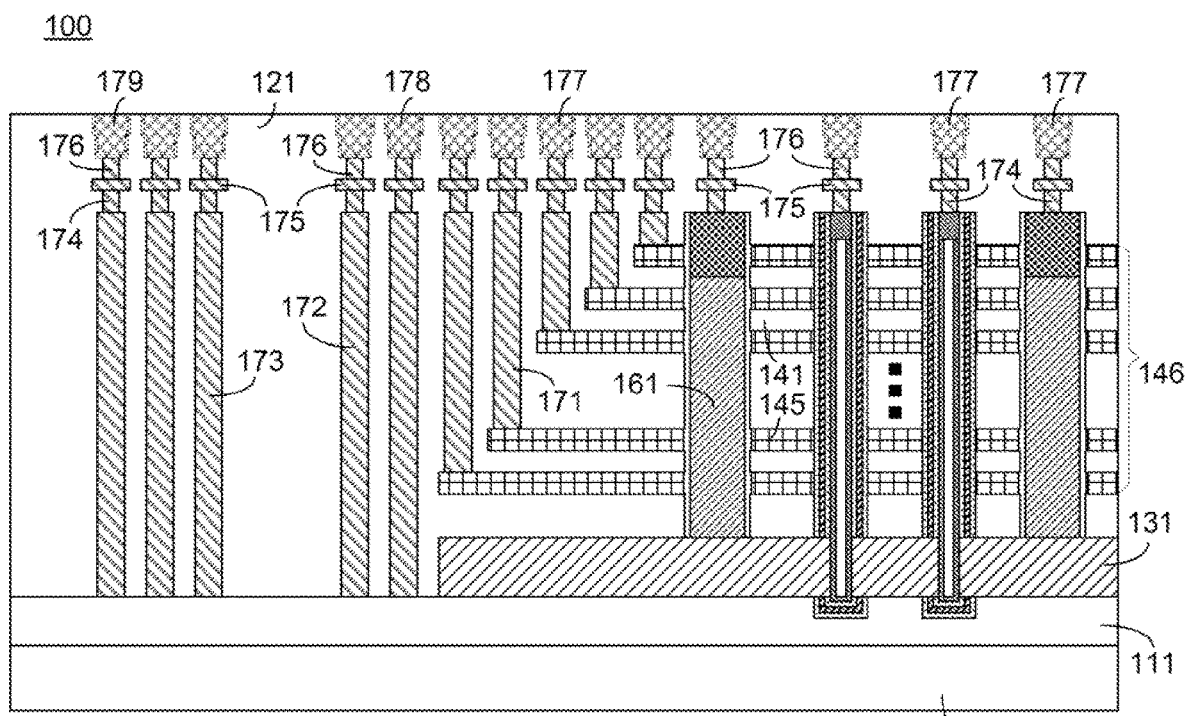

FIGS. 10 and 11 show schematic cross-sectional views of the 3D array device 100 at certain stages after contacts, vias, conductor layers, and connecting pads are formed according to aspects of the present disclosure. After the gate line slits 160 are filled and the array common source is formed as shown in FIG. 9, openings for word line contacts 171 and through silicon contacts 172-173 are formed respectively by, e.g., a dry etch process or a combination of dry and wet etch processes. The contacts 171-173 are arranged as interconnects for the 3D array device 100. The openings for the contacts 171-173 are respectively filled with a conductive material by CVD, PVD, ALD, electroplating, electroless plating, or any combination thereof. As shown in FIG. 10, the through silicon contacts 172 and 173 are formed in the contact region (i.e., a dielectric region) and beside the stack 146 and the NAND memory cells. The staircase structure is disposed between the contacts 172-173 and the stack 146, i.e., between the through silicon contacts 172-173 and the NAND memory cells. In some aspects, the contacts 172-173 extend to reach the doped region 111. Alternatively, the contacts 172-173 may extend to a level above the doped region 111 in the dielectric layer 121. The conductive material for the contacts 171-173 may include W, Co, Cu, Al, or a combination thereof. Optionally, a layer of a conductive material (e.g., TiN) may be deposited as a contact layer before another conductive material is deposited when the contacts 171-173 are fabricated respectively.

Further, a CVD or PVD process is performed to deposit a dielectric material (e.g., silicon oxide or silicon nitride) on the 3D array device 100, and the dielectric layer 121 becomes thicker. Openings for vias 174 are formed by a dry etch process or a combination of dry and wet etch processes. The openings may be subsequently filled with a conductive material such as W, Co, Cu, Al, or a combination thereof to form the vias 174, as shown in FIG. 10. CVD, PVD, ALD, electroplating, electroless plating, or a combination thereof may be performed. The vias 174 are connected to the contacts 171-173, the upper ends of NAND strings, and the plugs 162 of the array common source. The upper ends of NAND strings are connected to the bit lines, respectively. Optionally, a layer of a conductive material (e.g., TiN) may be deposited first before filling the openings to form the vias 174.

Further, conductor layers 175 for interconnect may be grown by CVD, PVD, ALD, electroplating, electroless plating, or a combination thereof. The conductor layers 175 are deposited over and contact the vias 174, respectively, and include a conductive material such as W, Co, Cu, Al, or a combination thereof. A part of the conductor layers 175 are connected to the bit lines through the vias 174.

As shown in FIG. 10, a portion 1700 of the 3D array device 100 includes some of the conductor layers 175 and vias 174. More details about making the conductor layers 175 are illustrated based on the portion 1700 in descriptions below in the present disclosure.

Similar to the formation of the vias 174, vias 176 are made over the conductor layers 175. For example, a dielectric material may be deposited to cover the conductor layers 175 and make the dielectric layer 121 thicker, openings for vias 176 may be formed, and the openings may be subsequently filled with a conductive material to form the vias 176.

Further, a CVD or PVD process is performed to deposit a dielectric material (e.g., silicon oxide or silicon nitride) to cover the vias 176 and thicken the dielectric layer 121 further. Openings are made and then filled to form connecting pads 177, 178, and 179 that serve as interconnects with a periphery device. As shown in FIG. 11, the connecting pads 177-179 are deposited over and contact the vias 176, respectively. As such, the connecting pads 177 are connected to the word line contacts 171, the upper ends of corresponding NAND strings, and the plugs 162, respectively. The connecting pads 178 and 179 are connected to the through silicon contacts 172 and 173, respectively. The connecting pads 177-179 may include a conductive material such as W, Co, Cu, Al, or a combination thereof. Optionally, a contact layer of a conductive material (e.g., TiN) may be deposited first before filling the openings to form the connecting pads 177-179.

The self-aligned multiple patterning (SAMP) is a cost-saving method that enables patterns with finer lines beyond the lithography limit. SAMP processes may include self-aligned double patterning (SADP) and self-aligned quadruple patterning (SAQP). In some cases, SAMP may be used to make the conductor layers 175 when the layers 175 are configured as dense metal lines with a narrow pitch.

FIGS. 12A-12I schematically depict an SAMP process in top and cross-sectional views according to aspects of the present disclosure. The top view is in an X-Y plane and the cross-sectional views are in an X-Z plane. Referring to FIG. 10, the dielectric layer 121 is at the top of the 3D array device 100, and the vias 174 are embedded in the layer 121. The top surface includes surface regions of the vias 174 and layer 121. Assuming that some of the conductor layers 175 are dense metal lines (not shown) configured over a portion of the conductor/insulator stack 146. Before starting the SAMP process (e.g., an SAQP process), the top surface of the device 100 is planarized in a planarization process.

Figure 12A:
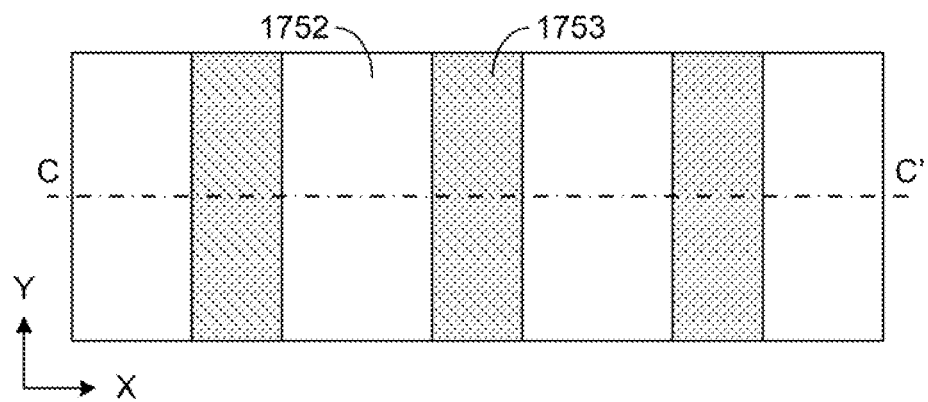
FIGS. 12A-12I illustrate top and cross-sectional views that describe a self-aligned multiple patterning (SAMP) process according to various aspects of the present disclosure.
Figure 12B:
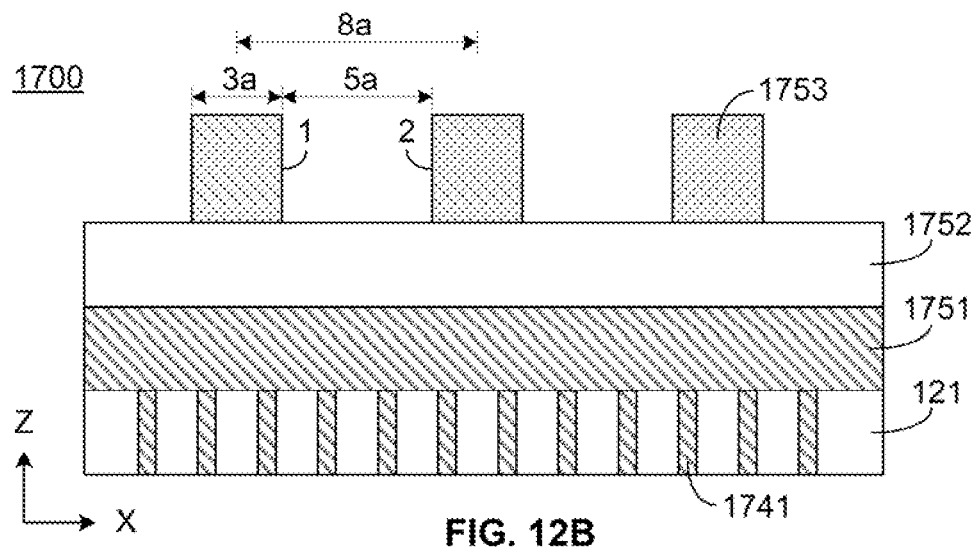

FIGS. 12A and 12B show a schematic top view and cross-sectional view of the portion 1700 of the 3D array device 100 according to aspects of the present disclosure. The cross-sectional view shown in FIG. 12B is taken along a line CC' of FIG. 12A. The portion 1700 reflects a top part above the stack 146 as depicted in FIG. 10. The vias 174 shown in FIG. 10 are schematically represented by vias 1741 shown in FIG. 12B and other figures. After the vias 1741 are made and the planarization process is performed, a conductive layer 1751 is conformally deposited over the dielectric layer 121. As such, the layer 1751 has approximately the same thickness across the region of the top surface. The conductive layer 1751 may include a metal layer with a metallic material, such as W, Cu, Al, Co, Ti, any alloy thereof, or any combination (or mixtures) thereof. The word "alloy", as used herein, indicates a mixture composed of a metal element and a nonmetal element (e.g., carbon, oxygen, nitrogen, or sulfur). The layer 1751 may be deposited by CVD, PVD, ALD, or any combination thereof. In some cases, the metallic material is deposited on the planarized top surface directly. As such, some portions of the layer 1751 contact and connect to the vias 1741 directly. Optionally, a contact layer of a conductive material (e.g., TiN) may be deposited on the planarized top surface before growing the layer 1751.

Further, a mask layer such as a hard mask 1752 is deposited over the conductive layer 1751. The hard mask 1752 includes one or more layers that include one or more materials.

The material for the hard mask 1752 includes, for example, silicon oxide, silicon nitride, silicon oxynitride, polysilicon, amorphous silicon, or aluminum oxide. Over the hard mask 1752, a core pattern is created by lithography, which may be referred to as the first mandrel pattern. The first mandrel pattern is represented by blocks 1753 made of a material such as photoresist.

Figure 12C:
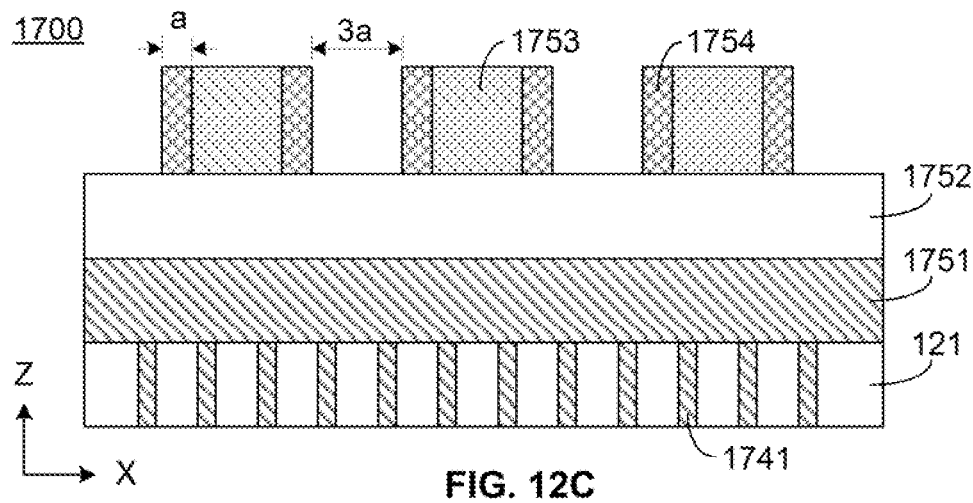

As shown in FIGS. 12A-12B, the width of the block 1753 is 3a, the width of the space between opposite sidewalls 1 and 2 is 5a, and the pitch of the first mandrel pattern is 8a. Then, a first dielectric material (e.g., silicon oxide or silicon nitride) is deposited conformally via CVD and/or ALD. The deposition process generates a conformal layer that covers the blocks 1753 and the exposed parts of the hard mask 1752, and has approximately the same thickness when covering different geometric features. After a dry etch process such as a reactive ion etch (RIE) process, the conformal layer is etched directionally, and sidewall spacers 1754 proximate the block 1753 are created. As shown in FIG. 12C, the sidewall spacer 1754 has a width a along the X direction. The spacing between two sidewall spacers 1754 is 3a. In some aspects, the width of the sidewall spacer 1754 (i.e., the value of a) is 50 nanometers (nm) or less. In some other aspects, the width of the sidewall spacer 1754 is 20 nm, 10 nm, or less than 10 nm. Besides the sidewall spacer 1754, other sidewall spacers made in the SAQP process have the same or a similar width value.

The first mandrel pattern (i.e., the blocks 1753) is removed in a selective etch process (e.g., a selective wet etch process). The selective etch leaves sidewall spacers 1754 on the hard mask. The sidewall spacers 1754 represent the second mandrel pattern.

Figure 12D:
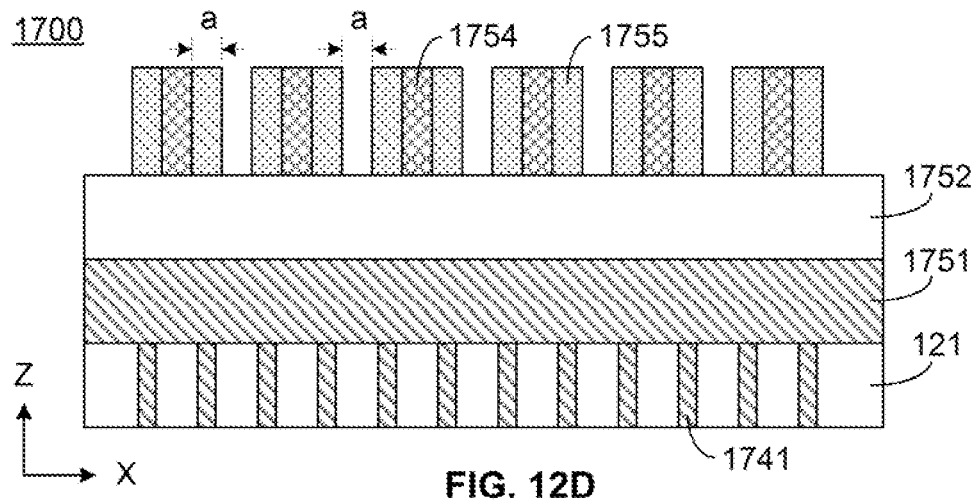

Further, a second dielectric material (e.g., silicon oxide or silicon nitride) is deposited via CVD and/or ALD to grow a conformal layer. The conformal layer covers the sidewall spacers 1754 and exposed parts of the hard mask 1752. With a dry etch process such as RIE, the conformal layer is etched directionally and sidewall spacers 1755 are formed, as depicted in FIG. 12D. Similar to the spacer 1754, the width of the spacer 1755 is a. The spacing between two adjacent spacers 1755 is also a.

Figure 12E:
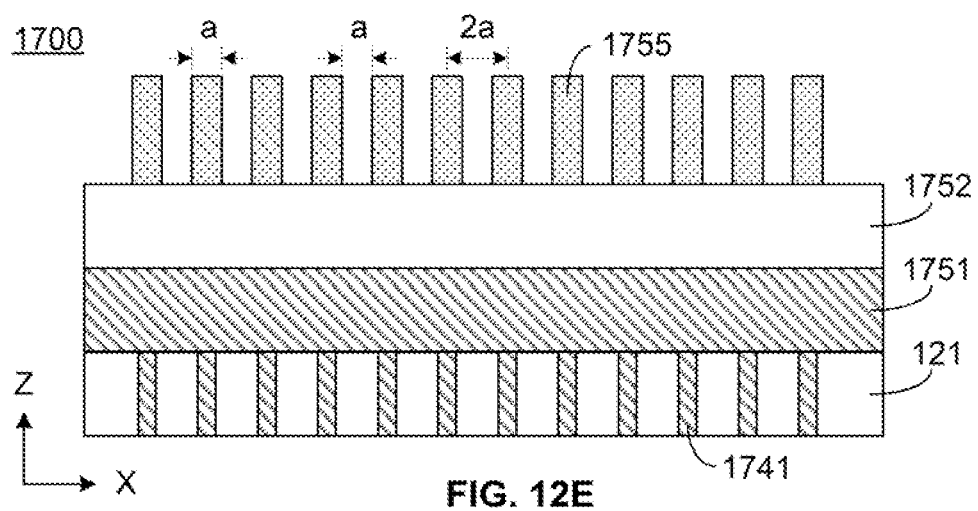
Figure 12F:
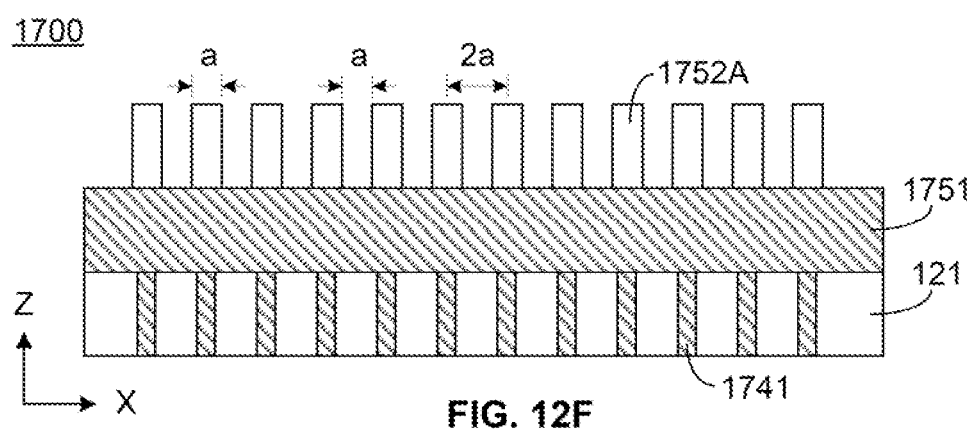

The second mandrel pattern (i.e., the spacers 1754) is removed in a selective etch process (e.g., a selective wet etch process). The sidewall spacers 1755 left by the selective etch represent the desired pattern, which has a pitch of 2a, as illustrated in FIG. 12E. Further, a dry etch process such as RIE is performed to etch the sidewall spacers 1755 and exposed regions of the hard mask 1752. As shown in FIG. 12F, after the dry etch removes the exposed portions of the hard mask, blocks 1752A are formed, and the desired pattern is transferred to the hard mask.

Figure 12G:
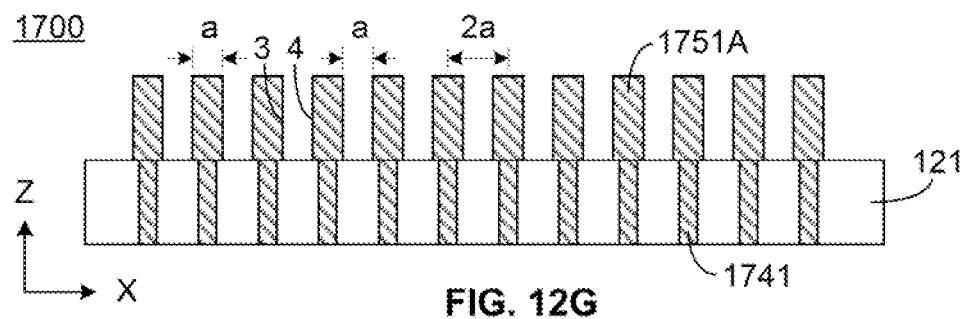

Further, a subsequent dry etch process such as RIE is performed to etch the blocks 1752A and exposed portions of the conductive layer 1751. After the dry etch, the exposed portions of the conductive layer 1751 are removed, and openings are created in the conductive layer 1751 that expose the dielectric layer 121 underneath the conductive layer. As shown in FIG. 12G, conductive blocks 1751A are formed on the dielectric layer 121, aligned with the vias 1741, and based on a desired pattern. Further, the conductive blocks 1751A are disposed over and contact the vias 1741, respectively. In some cases, the conductive blocks 1751A are metal lines. Then, the width of the metal lines is a and the line pitch is 2a. Compared to the first mandrel pattern, both the line width and line pitch are reduced using sidewall spacers in the SAMP process. As aforementioned, the conductive blocks 1751A correspond to the conductor layers 175 with respect to FIGS. 10-11.

Referring to FIG. 12G, adjacent conductive blocks 1751A are separated by an opening along the X direction. The width of the opening is a, which is the distance between two opposite sidewalls (e.g., sidewalls 3 and 4) of the blocks 1751A. As the blocks 1751A are made by removing certain portions of the layer 1751, the sidewall and sidewall surface of the block 1751A are made of the conductive material of the layer 1751. For example, if the layer 1751 is a W layer, the material of the sidewall and sidewall surface of the blocks 1751A is also W.

Figure 12H:
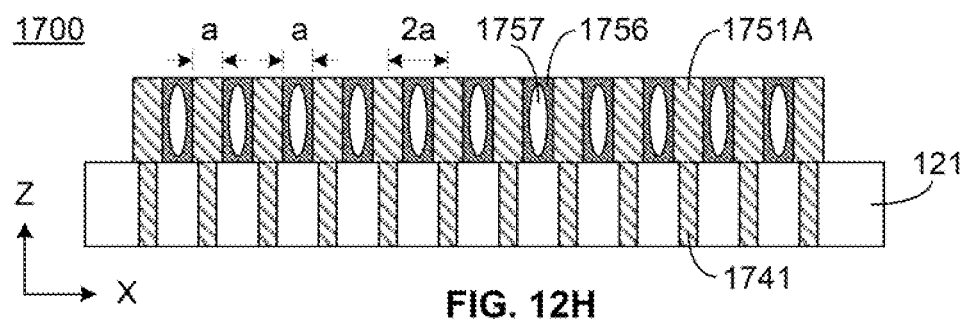

The opening between the blocks 1751A is filled by a dielectric material 1756 using a deposition process such as CVD. The deposition is arranged non-conformal such that airgaps 1757 are formed subsequently. As shown in FIG. 12H, the dielectric material 1756 is deposited directly on the sidewall (or sidewall surface) of the block 1751A and the bottom of the opening. The airgap 1757 is surrounded by the dielectric material 1756 and formed in a space of the opening. As a result, there is only the dielectric material 1756 between the airgap 1757 and the sidewall (or the sidewall surface) of the block 1751A. In other words, there is only the dielectric material 1756 between the airgap 1757 and the conductive material of the block 1751A. The dielectric material 1756 includes, for example, silicon oxide, silicon nitride, silicon oxynitride, aluminum oxide, etc. In some cases, after the formation of the airgaps 1757, a different dielectric material may be used to continue filling of the openings. As such, the airgap is buried under layers of different materials, which may facilitate an etch-back process in some cases.

Figure 12I:
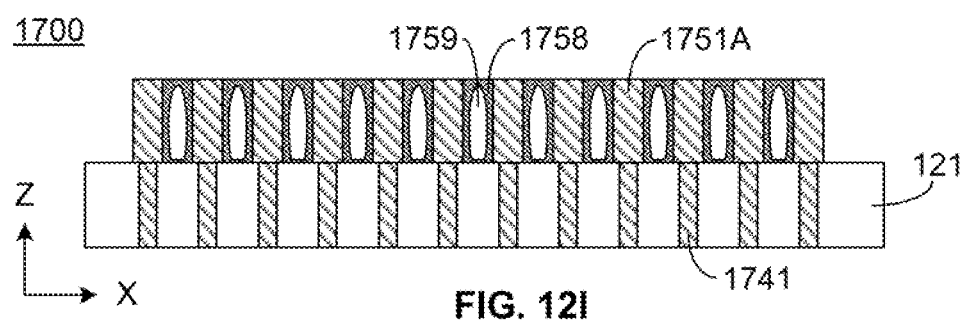

As the blocks 1751A are tightly pitched, the airgaps 1757 are arranged to reduce the capacitance. Optionally, the airgap may be enlarged to decrease the capacitance further. For example, the openings may be filled partially by depositing a dielectric material 1758, followed by a dry etch that etches out some materials at the bottom of the openings. Then the filling process resumes, the openings are filled, and airgaps 1759 are formed. As shown in FIG. 12I, the width of the lower portion (or lower end portion) of the airgap 1759 is larger than that of the upper portion (or upper end portion) of the airgap. The lower portion of the airgap 1759 is closer to the dielectric layer 121 than the upper portion of the airgap. Compared with the airgap 1757, the airgap 1759 is larger and the capacitance may be reduced further.

Additionally or optionally, tightly pitched metal lines may also be made by forming trench openings in a dielectric layer using SAMP, depositing a contact layer (or barrier layer) on the sidewall and bottom surface of the trench opening (e.g., depositing a TiN layer by CVD), and then filling the openings with a metal (e.g., depositing W by CVD). Metal lines produced by such a method, however, have larger electrical resistance than those made by the methods as illustrated above with respect to FIGS. 12A-12I, especially when the conductive layer 1751 is formed by PVD.

Figure 13:
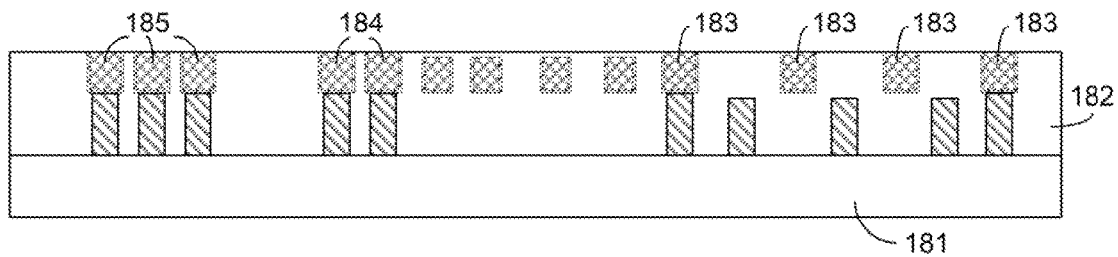
FIG. 13 illustrates a cross-sectional view of an exemplary periphery device according to various aspects of the present disclosure.

FIG. 13 shows a schematic cross-sectional view of a periphery device 180 according to aspects of the present disclosure. The periphery device 180 is a part of a memory device and may also be referred to as a peripheral structure. The periphery device 180 includes a substrate 181 that may include single crystalline silicon, Ge, SiGe, SiC, SOI, GOI, polysilicon, or a Group III-V compound such as GaAs or InP. Periphery CMOS circuits (e.g., control circuits) (not shown) are fabricated on the substrate 181 and used for facilitating the operation of the array device 100. For example, the periphery CMOS circuits may include metal-oxide-semiconductor field-effect transistors (MOSFETs) and provide functional devices such as page buffers, sense amplifiers, column decoders, and row decoders. A dielectric layer 182 is deposited over the substrate 181 and the CMOS circuits. Connecting pads (such as connecting pads 183, 184, and 185) and vias are formed in the dielectric layer 182. The dielectric layer 182 includes one or more dielectric materials such as silicon oxide and silicon nitride. The connecting pads 183-185 are configured as interconnects with the 3D array device 100 and may include a conductive material such as W, Co, Cu, Al, or a combination thereof For the 3D array device 100 and periphery device 180, the bottom side of the substrate 110 or 181 may be referred to as the back side, and the side with the connecting pads 177-179 or 183-185 may be referred to as the front side or face side.

Figure 14:
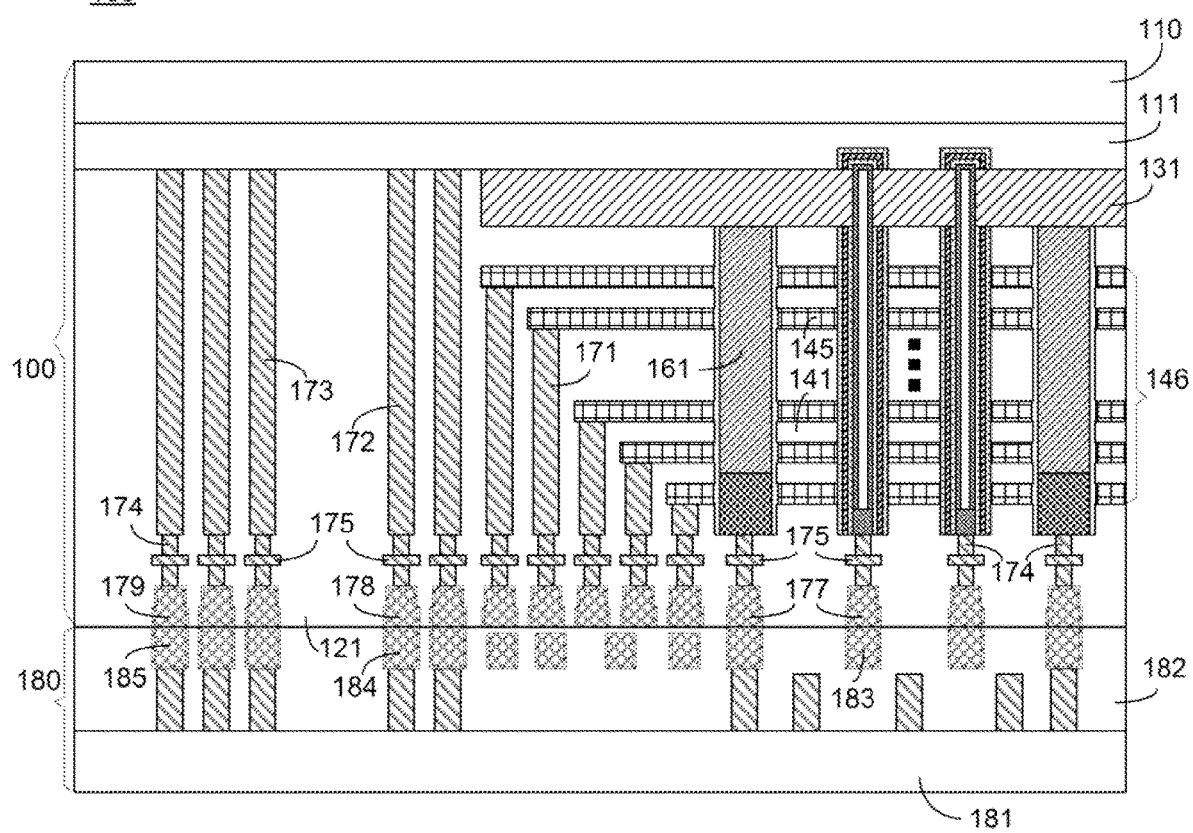
FIG. 14 illustrates a cross-sectional view of a 3D memory device after the 3D array device shown in FIG. 11 is bonded with the periphery device shown in FIG. 13 according to various aspects of the present disclosure.

FIG. 14 schematically shows a fabrication process of an exemplary 3D memory device 190 in a cross-sectional view according to aspects of the present disclosure. The 3D memory device 190 includes the 3D array device 100 shown in FIG. 11 and the periphery device 180 shown in FIG. 13.

The 3D array device 100 and periphery device 180 are bonded by a flip-chip bonding method to form the 3D memory device 190, as shown in FIG. 14. In some aspects, the 3D array device 100 is flipped vertically and becomes upside down with the top surfaces of the connecting pads 177-179 facing downward. The two devices are placed together such that the 3D array device 100 is above the periphery device 180. After an alignment is made, e.g., the connecting pads 177-179 are aligned with the connecting pads 183-185, respectively, the 3D array device 100 and periphery device 180 are joined face to face and bonded together. The conductor/insulator stack 146 and the periphery CMOS circuits become sandwiched between the substrates 110 and 181 or between the doped region 111 and the substrate 181. In some aspects, a solder or a conductive adhesive is used to bond the connecting pads 177-179 with the connecting pads 183-185, respectively. As such, the connecting pads 177-179 are connected to the connecting pads 183-185, respectively. The 3D array device 100 and periphery device 180 are in electrical communication after the flip-chip bonding process is completed.

Further, other fabrication steps or processes are performed to complete fabrication of the 3D memory device 190. The other fabrication steps and processes are not reflected in FIG. 14 for simplicity. For example, from the bottom surface (after the flip-chip bonding), the substrate 110 of the 3D array device 100 is thinned by a thinning process, such as wafer grinding, dry etch, wet etch, CMP, or a combination thereof. A dielectric layer is grown over the doped region 111 by a deposition process (e.g., a CVD or PVD process). With similar methods as described above, vias and conductor layers are formed that connect the through silicon contacts 172 and 173, respectively. Further, a passivation layer is deposited and contact pads are formed that connect contacts 172 and/or 173. Further, additional fabrication steps or processes are performed. Details of the additional fabrication steps or processes are omitted for simplicity.

Figure 15:
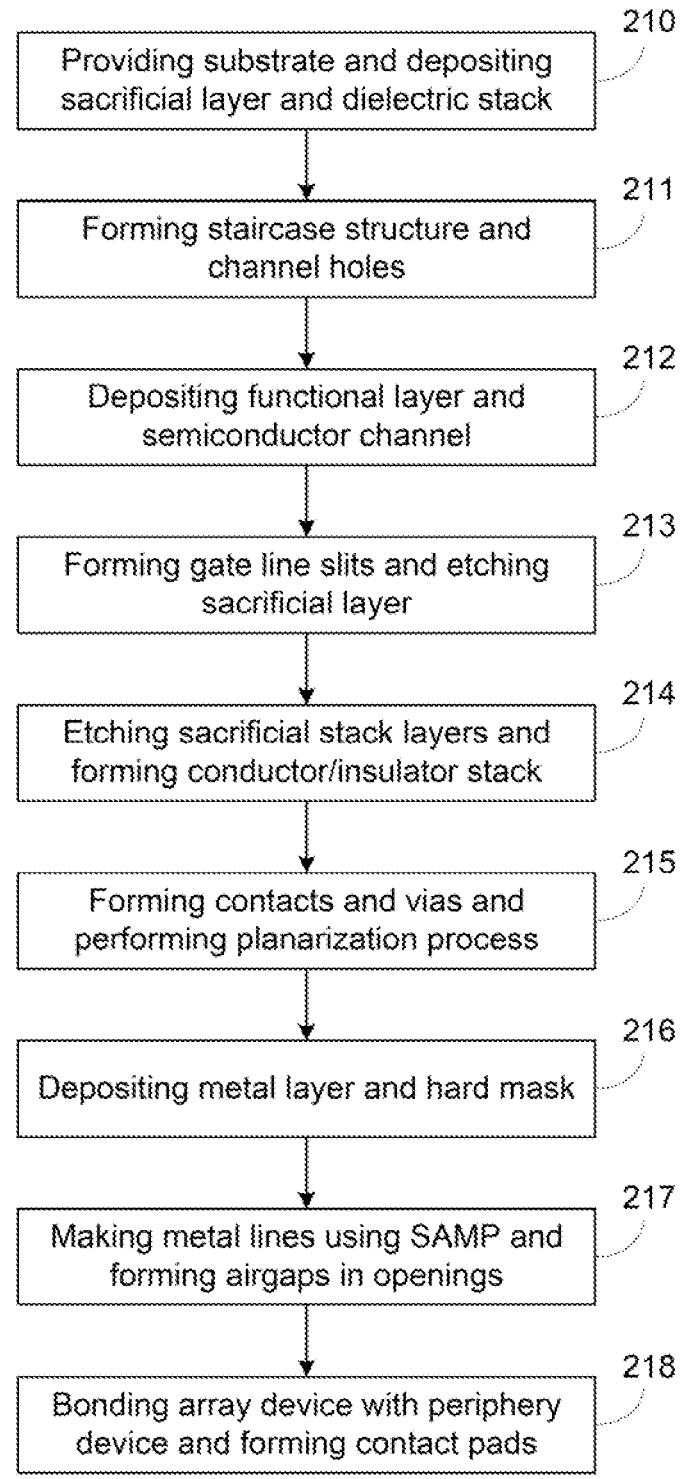
FIG. 15 illustrates a schematic flow chart of fabrication of a 3D memory device according to various aspects of the present disclosure.

FIG. 15 shows a schematic flow chart 200 for fabricating a 3D memory device according to aspects of the present disclosure (e.g., referring above FIGS for structures of the 3D memory device during the fabrication process). At 210, a substrate is provided for fabricating a 3D array device. A sacrificial layer is deposited over a top surface of the substrate. The substrate includes a semiconductor substrate, such as a single crystalline silicon substrate. In some aspects, a cover layer is grown on the substrate before depositing the sacrificial layer. The cover layer includes a single layer or multiple layers that are grown sequentially over the substrate. For example, the cover layer may include silicon oxide, silicon nitride, and/or aluminum oxide. In some other aspects, the sacrificial layer may be deposited without first depositing the cover layer over the substrate. The sacrificial layer may include single crystalline silicon, polysilicon, silicon oxide, or silicon nitride.

Over the sacrificial layer, a dielectric stack of the 3D array device is fabricated. The dielectric stack includes a first stack layer and a second stack layer that are alternately stacked. The first stack layer includes a first dielectric layer and the second stack layer includes a second dielectric layer that is different than the first dielectric layer. In some aspects, one of the first and second dielectric layers is used as a sacrificial stack layer.

At 211, a staircase formation process is performed to convert a portion of the dielectric stack into a staircase structure. The staircase formation process includes multiple etches that are used to trim the portion of the dielectric stack into the staircase structure. A deposition process is performed to deposit a dielectric layer to cover the staircase structure. A part of the dielectric layer on a side of the staircase structure is used as a contact region where through silicon contacts for contact pads are configured. Further, channel holes are formed that extend through the dielectric stack and the sacrificial layer to expose portions of the substrate.

At 212, a functional layer is deposited on the sidewall and bottom surface of the channel hole. The functional layer includes a blocking layer, a charge trap layer, and a tunneling layer that are formed sequentially. Further, a semiconductor channel is deposited on a surface of the tunneling layer.

At 213, gate line slits of the 3D array device are formed. Along a direction vertical to the substrate, the gate line slit extends through the dielectric stack. The gate line slits expose portions of the sacrificial layer. Further, the sacrificial layer is etched away and a cavity is created above the substrate. The cavity exposes a bottom portion of the functional layer in the cavity. The cover layer is also exposed in the cavity, if it is deposited on the substrate. The layers of the functional layer exposed sequentially in the cavity, including the blocking layer, the charge trap layer, and the tunneling layer, are etched away, respectively. That is, the bottom portion of the functional layer that is close to the substrate is removed. The cover layer, if deposited, is also etched away during the process to etch the bottom portion of the functional layer or in another selective etch process. Hence, a potion of the substrate and portions of the semiconductor channel are exposed in the cavity.

Further, a deposition process is performed to grow a semiconductor layer such as a polysilicon layer in the cavity. The semiconductor layer contacts the semiconductor channel and the substrate.

In some aspects, the dielectric stack includes two dielectric stack layers and one of the dielectric stack layers is sacrificial. The sacrificial stack layers are etched away at 214 to leave cavities in the dielectric stack. Further, the cavities are filled with a conductive material to form conductive layers. The dielectric stack is transformed into a conductor/insulator stack. Further, a dielectric layer is deposited on the side wall and bottom surface of the gate line slits. Portions of the dielectric layer on the bottom surface are etched out selectively to expose the semiconductor layer. Conductive materials, such as TiN, W, Cu, Al, and/or doped polysilicon are deposited in the gate line slits to form an array common source that contacts the semiconductor layer.

At 215, etching and deposition processes are performed to form word line contacts, through silicon contacts, and vias. A planarization process is performed to create a planar top surface after the vias are made. The planar top surface includes surfaces of the vias and a dielectric layer that surrounds or buries the vias.

At 216, a conformal conductive layer is deposited over the planar top surface by CVD, PVD, ALD, or any combination thereof. In descriptions below, an exemplary conductive layer is a metal layer such as a W layer. A mask layer such as a hard mask is formed over the metal layer.

At 217, a mandrel pattern made of a material (e.g., photoresist) is formed over the mask layer. Further, a SAMP process (e.g., SADP or SAQP) is performed to generate a desired pattern formed by sidewall spacers. The desired pattern has a narrower line width and line pitch than that of the mandrel pattern. Further, the desired pattern is transferred to the mask layer using the sidewall spacers, which transforms the mask layer into a patterned mask layer. Subsequently, the metal layer is etched using the patterned mask layer by a directional etch process (e.g., RIE).

Corresponding to the desired pattern, certain portions of the metal layer are removed, which creates openings and tightly pitched metal lines separated by the openings. Some metal lines are formed on and contact certain vias beneath the metal layer, respectively. The openings expose some surface regions of the dielectric layer surrounding the vias. The width of the opening is the distance between opposite sidewalls of the metal lines. Further, a dielectric material is deposited in the space of the opening. For example, the dielectric material may be deposited directly on surfaces of the sidewall of the metal line and the bottom of the opening. As the deposition is non-conformal, airgaps are formed in the space of the openings, and fill the opening with the dielectric material. The metal layer becomes a region consisting of metal lines, airgaps, and the dielectric material.

At 218, another dielectric material is deposited to cover the metal lines.

Connecting pads for the 3D array device are made to connect some of the metal lines. Further, a flip-chip bonding process may be performed to bond the 3D array device and a periphery device or fasten the 3D array device with a periphery device to create a 3D memory device. In some aspects, the 3D array device is flipped upside down and positioned above the periphery device. The connecting pads of the 3D array device and the periphery device are aligned and then bonded. After the substrate of the 3D array device is thinned, etching and deposition processes are performed to form vias, conductor layers, and contact pads over the through silicon contacts in the contact region of the 3D array device. The contact pads are configured for wire bonding for connection with other devices.

As illustrated above, the capacitance of dense metal lines may be reduced by airgaps formed between them. The resistance of the metal lines may also be reduced when the metal lines are formed by etching a metal layer deposited by a PVD process. Since the above-described methods and processes are about semiconductor manufacturing, these methods and processes apply to fabrication of a wide range of semiconductor devices.

Figure 16:
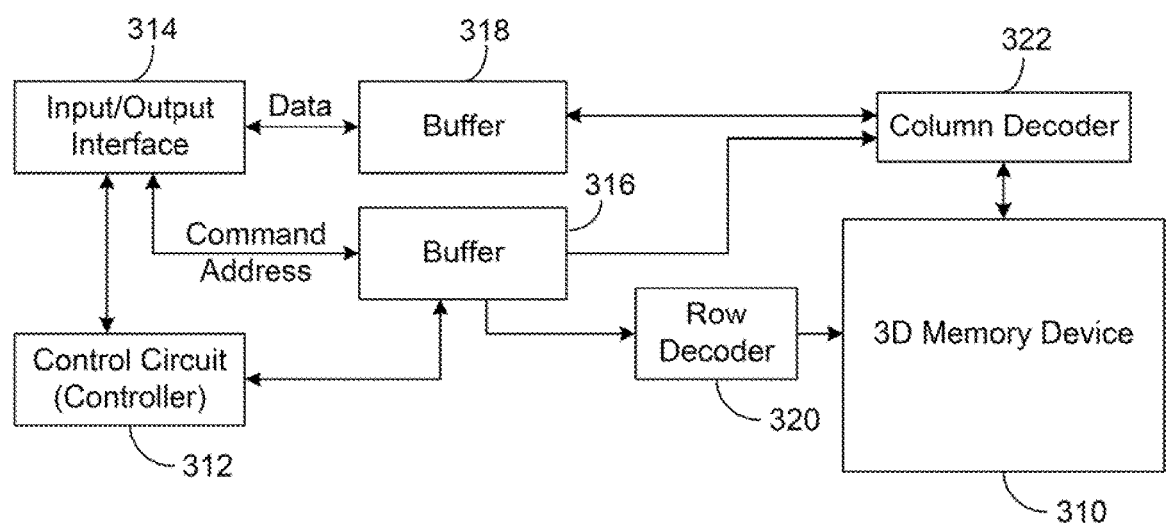
FIG. 16 illustrates a block diagram of a memory apparatus according to various embodiments of the present disclosure.

FIG. 16 shows a block diagram of a memory apparatus 300 according to embodiments of the present disclosure. Examples of the memory apparatus 300 may include data storage devices such as a solid-state drive (SSD), a universal flash storage (UFS) memory device, a multimedia card (MMC), an embedded multimedia card (eMMC), etc. The memory apparatus 300 may contain a 3D memory device such as the 3D memory device 190 illustrated above and shown in FIG. 14. As the 3D memory device 190 has improved performance due to the reasons described above, when the device 190 is used, the memory apparatus 300 may have improved performance, as well. As shown in FIG. 16, the memory apparatus 300 contains a 3D memory device 310 (e.g., the device 190) and a control circuit 312 that functions as a controller of the memory apparatus 300. The 3D memory device 310 may include one or more 3D memory arrays. The memory apparatus 300 further contains an input/output (I/O) interface 314, a buffer 316, a buffer 318, a row decoder 320, and a column decoder 322. The control circuit 312 implements various functions of the memory apparatus 300. For example, the control circuit 312 may implement read operations, write operations, and erase operations. The I/O interface 314, which may also be referred to as an I/O component or I/O connections, contains an I/O circuit to receive an input of command signals, address signals, and data signals to the memory apparatus 300 and transmit data and status information from the memory apparatus 300 to another device (e.g., a host device). The buffer 316 buffers or temporarily stores command/address signals, while the buffer 318 buffers or temporarily stores data signals. Optionally, the buffers 316 and 318 may be combined into a single buffering device. The row decoder 320 and column decoder 322 decode row and column address signals respectively for accessing the 3D memory device 310. The I/O interface 314 detects command signals, address signals, and data signals from the input. In some cases, the I/O interface 314 may transmit command and/or address signals to the buffer 316, and transmit data signals to the buffer 318. For simplicity, other components and functions of the memory apparatus 300 are omitted.

Although the principles and implementations of the present disclosure are described by using specific aspects in the specification, the foregoing descriptions of the aspects are only intended to help understand the present disclosure. In addition, features of aforementioned different aspects may be combined to form additional aspects. A person of ordinary skill in the art may make modifications to the specific implementations and application range according to the idea of the present disclosure. Hence, the content of the specification should not be construed as a limitation to the present disclosure.

What is claimed is:

1. A method for fabricating a semiconductor device, comprising:
    providing a substrate;
    forming a conductive layer including a conductive material over a part of the substrate, the conductive layer having a first surface in contact with the substrate and a second surface parallel to and vertically separated from the first surface in a first direction away from the substrate;
    removing a portion of the conductive layer to form an opening in the conductive layer and a sidewall in the opening, a surface of the sidewall including the conductive material;
    depositing a first dielectric material in a space of the opening to form an airgap in the space, the first dielectric material surrounding the airgap, wherein there is only the first dielectric material between the conductive material of the sidewall and the airgap; and
    responsive to formation of the airgap, depositing a second dielectric material in the space of the opening and on top of the first dielectric material forming the airgap to fill the space of the opening, the second dielectric material having a third surface and a fourth surface, wherein the third surface is located between the first surface and the second surface, and wherein the fourth surface is parallel to and vertically separated from the third surface in the first direction.

2. The method according to claim 1, wherein forming the conductive layer includes:
    forming the conductive layer using a chemical vapor deposition (CVD) process, a physical vapor deposition (PVD) process, an atomic layer deposition (ALD) process, or any combination thereof.

3. The method according to claim 1, wherein removing the portion of the conductive layer to form the opening includes:
    producing a pattern using a self-aligned multiple patterning (SAMP) process.

4. The method according to claim 1, wherein a width of the opening is 50 nanometers or less.

5. The method according to claim 1, further comprising:
    depositing the first dielectric material directly on the surface of the sidewall when depositing the first dielectric material in the space of the opening.

6. The method according to claim 1, further comprising:
    forming a mask layer over the conductive layer and transferring a pattern of the mask layer to the conductive layer when removing the portion of the conductive layer.

7. The method according to claim 1, further comprising:
    forming a conductor/insulator stack over the substrate, a functional layer extending through the conductor/insulator stack and formed between a semiconductor channel and the conductor/insulator stack.

8. The method according to claim 7, further comprising:
    forming the functional layer on a sidewall of a channel hole that extends through the conductor/insulator stack, the functional layer including a blocking layer, a charge trap layer, and a tunneling layer; and
    forming the semiconductor channel on a surface of the tunneling layer.

9. A semiconductor device, comprising:
    a substrate; and
    a plurality of conductive blocks formed of a conductive material, with a plurality of sidewalls formed of the conductive material, and formed over a part of the substrate, the plurality of sidewalls separated by a space having first and second dielectric materials deposited therein and an airgap surrounded by the first dielectric material,
    wherein the second dielectric material is disposed between the plurality of sidewalls and on top of the first dielectric material surrounding the airgap, and wherein there is only the first dielectric material between the conductive material and the airgap.

10. The semiconductor device according to claim 9, wherein a width of the space is 50 nanometers or less.

11. The semiconductor device according to claim 9, wherein the plurality of conductive blocks are formed using a chemical vapor deposition (CVD) process, a physical vapor deposition (PVD) process, an atomic layer deposition (ALD) process, or any combination thereof.

12. The semiconductor device according to claim 9, wherein the first dielectric material is deposited on a surface of the plurality of sidewalls in the space.

13. The semiconductor device according to claim 9, wherein the conductive material includes tungsten (W), copper (Cu), aluminum (Al), cobalt (Co), titanium (Ti), any alloy thereof, or any combination thereof.

14. The semiconductor device according to claim 9, wherein a width of a first end portion of the airgap is larger than a width of a second end portion of the airgap, the first end portion of the airgap being closer to the substrate than the second end portion of the airgap.

15. The semiconductor device according to claim 9, further comprising:

a conductor/insulator stack, formed over the substrate; and a functional layer and a semiconductor channel, extending through the conductor/insulator stack, the functional layer formed between the semiconductor channel and the conductor/insulator stack.

16. The semiconductor device according to claim 15, wherein the functional layer includes a blocking layer, a charge trap layer, and a tunneling layer.

17. A memory apparatus, comprising:

an input/output (I/O) component for receiving an input;

a buffer for buffering a signal;

a controller for implementing an operation; and a three-dimensional (3D) memory device, the 3D memory device comprising:

a substrate; and a plurality of conductive blocks formed of a conductive material, with a plurality of sidewalls formed of the conductive material, and formed over a part of the substrate, the plurality of sidewalls separated by a space having first and second dielectric materials deposited therein and an airgap surrounded by the first dielectric material, wherein the second dielectric material is disposed between the plurality of sidewalls and on top of the first dielectric material surrounding the airgap, and wherein there is only the first dielectric material between the conductive material and the airgap.

18. The memory apparatus according to claim 17, wherein the first dielectric material is deposited on a surface of the plurality of sidewalls in the space.

19. The memory apparatus according to claim 17, further comprising:

a conductor/insulator stack, formed over the substrate; and a functional layer and a semiconductor channel, extending through the conductor/insulator stack, the functional layer formed between the semiconductor channel and the conductor/insulator stack.

20. The memory apparatus according to claim 18, wherein the first dielectric material directly contacts the surface.

* * * * *